(12) United States Patent
Park et al.

(10) Patent No.: US 10,404,183 B2
(45) Date of Patent: Sep. 3, 2019

(54) POWER UNIT AND POWER CONVERSION APPARATUS HAVING THE SAME

(71) Applicants: Hyundai Motor Company, Seoul (KR); Kia Motors Corporation, Seoul (KR)

(72) Inventors: Hyongjoon Park, Gyeonggi-do (KR); Minji Kim, Gangwon-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/820,776

(22) Filed: Nov. 22, 2017

(65) Prior Publication Data

US 2018/0145605 A1 May 24, 2018

(30) Foreign Application Priority Data

Nov. 22, 2016 (KR) ........................ 10-2016-0156018

(51) Int. Cl.

| H02P 1/00 | (2006.01) |
| H02P 3/00 | (2006.01) |
| H02P 5/00 | (2016.01) |
| H02M 7/00 | (2006.01) |
| B60W 20/00 | (2016.01) |
| H02P 27/06 | (2006.01) |

(Continued)

(52) U.S. Cl.
CPC ............. *H02M 7/003* (2013.01); *B60L 3/003* (2013.01); *B60W 20/00* (2013.01); *H02P 27/06* (2013.01); *H05K 7/2089* (2013.01); *H05K 7/20927* (2013.01); *B60L 2240/526* (2013.01); *Y02T 90/34* (2013.01); *Y10S 903/93* (2013.01)

(58) Field of Classification Search
CPC .......... H02M 7/003; B60L 3/003; B60L 11/02
USPC ....................................................... 318/139
See application file for complete search history.

(56) References Cited

U.S. PATENT DOCUMENTS

2006/0119512 A1* 6/2006 Yoshimatsu .......... H01L 25/112
342/372
2009/0231811 A1* 9/2009 Tokuyama .............. H01L 23/36
361/699

(Continued)

FOREIGN PATENT DOCUMENTS

KR 10-2010-0042905 A 5/2011
KR 2013-0017225 A 12/2013

*Primary Examiner* — Erick D Glass
(74) *Attorney, Agent, or Firm* — Mintz Levin Cohn Ferris Glovsky and Popeo, P.C.; Peter F. Corless

(57) ABSTRACT

A power unit according to an exemplary embodiment of the present disclosure may include: a power module which is configured by a power conversion switching element, the power module having a first side having gate pins connected to a board, and a second side to which main busbars are connected; cooling modules which are disposed on both surfaces of the power module, respectively; capacitor modules which are disposed on outer surfaces of the cooling modules, respectively, and have capacitors that are electrically connected to the main busbars through connecting busbars, respectively; a coolant supply pipe which is connected to one end portion of each of the cooling modules to supply a coolant to the cooling module; and a coolant discharge pipe which is connected to another end portion of each of the cooling modules to discharge a coolant discharged from the cooling module.

15 Claims, 4 Drawing Sheets

(51) Int. Cl.
*H05K 7/20* (2006.01)
*B60L 3/00* (2019.01)

(56) References Cited

U.S. PATENT DOCUMENTS

| | | | | |
|---|---|---|---|---|
| 2011/0051371 | A1* | 3/2011 | Azuma | B60K 6/445 |
| | | | | 361/699 |
| 2014/0078803 | A1* | 3/2014 | Nishihara | H02M 7/003 |
| | | | | 363/141 |
| 2015/0382501 | A1* | 12/2015 | Horiuchi | H05K 7/20927 |
| | | | | 363/131 |
| 2017/0036563 | A1* | 2/2017 | Degner | B60L 15/04 |
| 2017/0259691 | A1* | 9/2017 | Lei | B60L 11/1874 |
| 2018/0168075 | A1* | 6/2018 | Okazaki | H05K 7/20272 |
| 2018/0281605 | A1* | 10/2018 | Sawazaki | B60L 50/51 |

* cited by examiner

POWER UNIT AND POWER CONVERSION APPARATUS HAVING THE SAME

CROSS-REFERENCE TO RELATED APPLICATION

This application claims under 35 U.S.C. § 119(a) the benefit of Korean Patent Application No. 10-2016-0156018 filed in the Korean Intellectual Property Office on Nov. 22, 2016, the entire contents of which are incorporated herein by reference.

BACKGROUND

(a) Technical Field

The present disclosure relates to a power unit with an optimized structure for assembling a power module and a capacitor module, and a power conversion apparatus having the same.

(b) Description of the Related Art

In conjunction with increased interest in energy conservation and alternative energy, vehicles such as hybrid vehicles, electric vehicles, and fuel cell vehicles are increasingly being substituted for vehicles with internal combustion engines.

In a hybrid vehicle, an electric vehicle, and a fuel cell vehicle, an engine and a high-output motor are utilized as power sources.

Further, in the hybrid vehicle, the electric vehicle, and the fuel cell vehicle, an inverter system, which converts high-voltage direct current power generated by a battery or a fuel cell into three-phase alternating current power with U, V, and W phases, is utilized to charge or discharge electrical energy produced therein.

The inverter system is provided with a power module which includes a power conversion switching element (insulated gate bipolar transistor (IGBT)), and a capacitor module which absorbs ripple current generated by a switching operation of a semiconductor switching element for power of the power module.

The capacitor module is electrically connected, through a busbar, to the power module and a high-voltage DC input terminal which is an input terminal of the inverter.

Typically, the most important factor to be considered in designing the power module of the inverter is a cooling structure because an output performance may depend on a cooling performance.

Therefore, research has been conducted on an inverter unit in which a power module, a capacitor, a busbar, and a coolant flow path are configured in a single package such that cooling efficiency may be improved, a size may be reduced, and various specifications may be satisfied.

The above information disclosed in this Background section is only for enhancement of understanding of the background of the disclosure and therefore it may contain information that does not form the prior art that is already known in this country to a person of ordinary skill in the art.

SUMMARY

The present disclosure provides a power unit and a power conversion apparatus incorporating the power unit which are capable of improving cooling efficiency, have a reduced size and a simplified structure, and are capable of handling having various capacities.

An exemplary embodiment of the present disclosure provides a power unit including: a power module which is configured by a power conversion switching element, the power module having a first side having gate pins connected to a board, and a second side to which main busbars are connected; cooling modules which are disposed on both surfaces of the power module, respectively; capacitor modules which are disposed on outer surfaces of the cooling modules, respectively, and have capacitors that are electrically connected to the main busbars through connecting busbars, respectively; a coolant supply pipe which is connected to one end portion of each of the cooling modules to supply a coolant to the cooling module; and a coolant discharge pipe which is connected to another end portion of each of the cooling modules to discharge a coolant discharged from the cooling module.

Coolant channels, which are connected between the coolant supply pipe and the coolant discharge pipe, may be formed in the cooling module, and a coolant passing through the coolant channel may absorb heat generated from the power module.

The coolant supply pipe and the coolant discharge pipe may extend side by side at both sides of the power module.

The capacitor module may include: a substrate which is disposed on one surface of the cooling module; the capacitors which are disposed on a surface of the substrate opposite to the surface in contact with the cooling module, and are electrically connected to the main busbars through the connecting busbar; and a capacitor housing which is formed along an outer edge of the substrate such that the substrate and the capacitor are disposed in the capacitor housing, and is in contact with the cooling module.

The capacitor housing and the cooling module may be joined together.

The capacitor housing may be made of a non-conductive material.

The main busbars and the capacitors may be electrically connected to one another through the connecting busbars, and the connecting busbars may be formed along an outer surface of the capacitor housing opposite to an inner surface of the capacitor housing which faces the cooling module so as to electrically connect the main busbars and the capacitors.

A protrusion may be formed at one side of an outer surface of the capacitor housing disposed to correspond to one surface of the power module, and a groove, which has a shape corresponding to a shape of the protrusion and is positioned to correspond to the protrusion, may be formed at one side of an outer surface of the capacitor housing disposed to correspond to the other surface of the power module.

The power module and the cooling module may be joined together.

The main busbars may include: a positive DC busbar which is connected to a positive direct current power source; a negative DC busbar which is connected to a negative direct current power source; and a phase busbar which is disposed at a preset interval from the positive and negative DC busbars.

Another exemplary embodiment of the present disclosure provides a power conversion apparatus in which the power units are stacked in series such that the connecting busbars of the neighboring capacitor modules are in contact with one another, the coolant supply pipes are connected to one another along a single axis, and the coolant discharge pipes are connected to one another along a single axis.

The power conversion apparatus may further include elastic members which elastically support the power units at both ends of the power units so as to maintain a state in which the power units are stacked.

Still another exemplary embodiment of the present disclosure provides a motor driving system including: the power conversion apparatus; a battery which supplies power to the power module; a board which transmits a control signal to the gate pins of the power module; and a motor which generates rotational force by using power supplied from the power module.

Yet another exemplary embodiment of the present disclosure provides a hybrid vehicle including: the motor driving system; and an internal combustion engine which generates rotational force together with the motor.

Still yet another exemplary embodiment of the present disclosure provides a fuel cell vehicle including: the motor driving system; and a fuel cell which is electrically connected to the battery and produces electricity through a chemical reaction.

A further exemplary embodiment of the present disclosure provides an electric vehicle which moves by using rotational force generated by the motor driving system.

According to the exemplary embodiments of the present disclosure, coolant flow paths are formed between the power modules and the capacitors, such that it is possible to improve a cooling performance and reduce a size.

In addition, it is possible to reduce inductance since the capacitors are mounted on the power modules, and with the stack structure, it is possible to effectively cope with a lineup having various capacities.

DETAILED DESCRIPTION OF THE EMBODIMENTS

Figure 1:
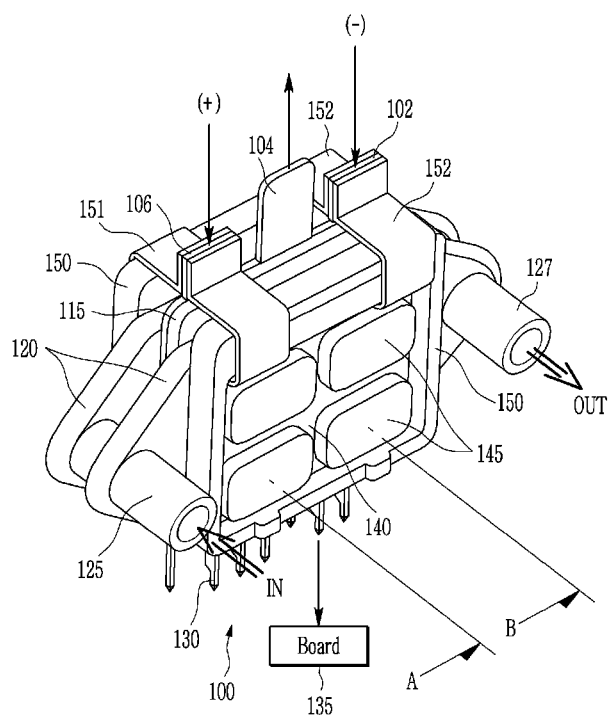
FIG. 1 is a perspective view of a power unit according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, an exemplary embodiment of the present disclosure will be described in detail with reference to the accompanying drawings.

The size and thickness of each component illustrated in the drawings are arbitrarily shown for understanding and ease of description, but the present disclosure is not limited thereto. Thicknesses of several portions and regions may be enlarged for clearly describing the above.

Parts irrelevant to the description will be omitted to clearly describe the exemplary embodiments of the present disclosure, and the same or similar constituent elements will be designated by the same reference numerals throughout the specification.

In the following description, names of constituent elements are classified as a first . . . , a second . . . , and the like so as to discriminate the constituent elements having the same name, and the names are not essentially limited to the order in the description below.

Figure 2:
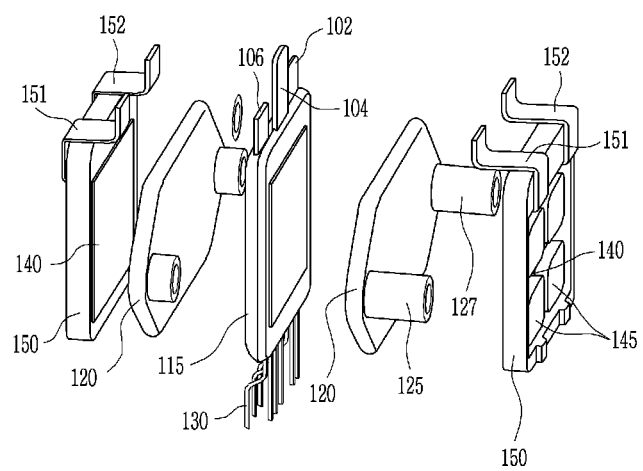
FIG. 2 is an exploded perspective view of the power unit according to the exemplary embodiment of the present disclosure.

FIG. 1 is a perspective view of a power unit according to an exemplary embodiment of the present disclosure, and FIG. 2 is an exploded perspective view of the power unit according to the exemplary embodiment of the present disclosure.

Referring to FIGS. 1 and 2, a power unit 100 includes a positive DC busbar 106, a phase busbar 104, a negative DC busbar 102, a capacitor housing 150, a power module 115, cooling modules 120, coolant supply pipes 125, gate pins 130, a board 135, capacitor modules, and coolant discharge pipes 127, and each of the capacitor modules includes a substrate 140, capacitors 145, and the capacitor housing 150.

The power module 115 is configured by a power conversion switching element, the gate pins 130, which are electrically connected to the board 135, are disposed at preset intervals along an edge of a lower portion of the power module 115, and main busbars are disposed at preset intervals along an edge of an upper portion of the power module 115.

The main busbars include the phase busbar 104 which is disposed at a center, and the positive DC busbar 106 and the negative DC busbar 102 which are formed at both sides of the phase busbar 104 with the phase busbar 104 therebetween.

The cooling modules 120 are disposed on both surfaces of the power module 115, respectively, the coolant supply pipe 125 is connected to one end portion of the cooling module 120, the coolant discharge pipe 127 is connected to another end portion of the cooling module 120, and the coolant supply pipe 125 and the coolant discharge pipe 127 are disposed side by side.

In the exemplary embodiment of the present disclosure, a coolant may absorb heat generated from the power module 115 while flowing along the cooling module 120, the cooling module 120 may include tubes through which the coolant passes, and fins which are disposed in the tubes, and the structure of the cooling module 120 is configured with reference to a publicly known technology.

The cooling modules are in contact with both surfaces of the power module 115, respectively, and the capacitor modules are disposed on both outer surfaces of the cooling modules 120. Each of the capacitor modules includes the substrate 140, the capacitors 145, the capacitor housing 150, and connecting busbars 151 and 152.

Each of the substrates 140 is disposed to be in contact with the outer surface of each of the cooling modules 120, and the capacitor housing 150 is formed in the form of a quadrangular frame along an outer edge of the substrate 140. Further, the four capacitors 145 are formed at preset intervals on an outer surface of each of the substrates 140. The capacitor 145 may be a multi-layered ceramic capacitor (MLCC).

Some of the capacitors 145 are connected to the positive DC busbar 106 through the first connecting busbar 151, and the remaining capacitors 145 are connected to the negative DC busbar 102 through the second connecting busbar 152.

The cooling modules 120 and the capacitor modules are disposed at both sides based on the power module 115, the first and second connecting busbars 151 and 152 are disposed at an upper side of an outer surface of the capacitor housing 150 of the capacitor module disposed at one side, and protrusions 200 are formed at a lower side of the outer surface of the capacitor housing 150.

Further, the first and second connecting busbars 151 and 152 are disposed at an upper side of an outer surface of the capacitor housing 150 of the capacitor module disposed at the other side of the power module 115, and grooves 201, which correspond to the protrusions 200, are formed at a lower side of the outer surface of the capacitor housing 150.

To connect in series the power units 100 (configured as illustrated in FIG. 1) according to the exemplary embodiment of the present disclosure, the several power modules 115 may be directly connected to one another by fastening the capacitor modules such that the protrusions 200 and the grooves 201 correspond to one another. Therefore, an overall capacity may be easily changed and adjusted.

Figure 4:
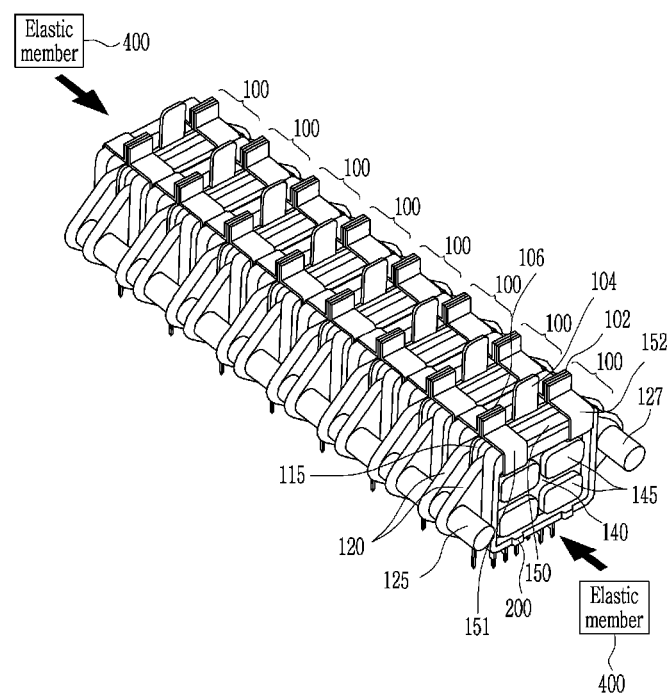
FIG. 4 is a perspective view of the power unit according to the exemplary embodiment of the present disclosure.

In addition, as illustrated in FIG. 4, the coolant supply pipes 125 connected to the cooling modules 120 are joined and sealed together, and the coolant discharge pipes 127 connected to the cooling modules 120 are joined and sealed together, such that the coolant supply pipes 125 may be connected to one another along a single axis to constitute a single pipe, and the coolant discharge pipes 127 may be connected to one another along a single axis to constitute a single pipe.

Figure 3:
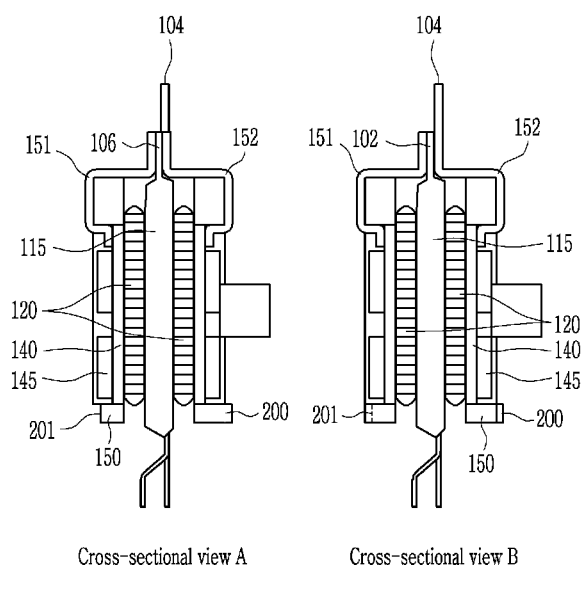
FIG. 3 is a cross-sectional view of the power unit according to the exemplary embodiment of the present disclosure.

FIG. 3 is a cross-sectional view of the power unit according to the exemplary embodiment of the present disclosure.

Referring to FIG. 3, in the power unit 100, the first connecting busbar 151 electrically connects the capacitor 145 and the positive DC busbar 106, and the second connecting busbar 152 electrically connects the capacitor 145 and the negative DC busbar 102.

Further, the first and second connecting busbars 151 and 152 are formed along the outer surface of the capacitor housing 150. Therefore, when the power units 100 having the configuration illustrated in FIG. 1 are connected to one another in series to be configured as illustrated in FIG. 4, the first and second connecting busbars 151 and 152 are in contact with one another to be electrically connected to one another.

Channels through which the coolant passes are formed in the cooling module 120, and a coolant passing through the channels absorbs heat generated from the substrate 140 and the power module 115 and dissipates the heat to the outside.

FIG. 4 is a perspective view of the power unit according to the exemplary embodiment of the present disclosure.

Referring to FIG. 4, the power units 100 illustrated in FIG. 1 are stacked and arranged in series. Here, the coolant supply pipes 125 are connected to one another and the coolant discharge pipes 127 are connected to one another as the capacitor housings 150 of the neighboring capacitor modules come into contact with one another. Here, the protrusion 200 and the groove 201 of the capacitor housings 150 are fastened to each other.

Further, elastic members 400 are disposed at both ends of the stack of the power units 100, and the elastic members 400 elastically support all of the inverters at both sides of the inverters, such that the stack structure of the stacked inverters is stably retained.

In the exemplary embodiment of the present disclosure, the power module 115 is supplied with direct current power from a fuel cell, a battery, or the like to produce three-phase alternating current power, and the produced alternating current power is applied to a motor to generate rotational force.

The motor may be used as a source of rotational force for a hybrid vehicle, a fuel cell vehicle, or an electric vehicle.

In the exemplary embodiment of the present disclosure, the capacitor housing and the cooling module may be joined together, the capacitor housing may be made of a non-conductive material, and the power module and the cooling module may be joined together.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A power unit, comprising:
    a power module which is configured by a power conversion switching element, the power module including a first side having gate pins connected to a board, and a second side to which main busbars are connected;
    cooling modules which are disposed on both surfaces of the power module, respectively;
    capacitor modules which are disposed on outer surfaces of the cooling modules, respectively, and have capacitors that are electrically connected to the main busbars through connecting busbars, respectively;
    a coolant supply pipe which is connected to one end portion of each of the cooling modules to supply a coolant to the cooling module; and a coolant discharge pipe which is connected to another end portion of each of the cooling modules to discharge a coolant discharged from the cooling module, wherein the capacitor module includes:
- a substrate which is disposed on one surface of the cooling module;
- the capacitors which are disposed on a surface of the substrate opposite to the surface in contact with the cooling module, and are electrically connected to the main busbars through the connecting busbar; and
- a capacitor housing which is formed along an outer edge of the substrate such that the substrate and the capacitor are disposed in the capacitor housing, and is in contact with the cooling module.

2. The power unit of claim 1, wherein:
coolant channels, which are connected between the coolant supply pipe and the coolant discharge pipe, are formed in the cooling module, and
a coolant passing through the coolant channel absorbs heat generated from the power module.

3. The power unit of claim 2, wherein the coolant supply pipe and the coolant discharge pipe extend side by side at both sides of the power module.

4. The power unit of claim 1, wherein the capacitor housing and the cooling module are joined together.

5. The power unit of claim 1, wherein the capacitor housing is made of a non-conductive material.

6. The power unit of claim 1, wherein:
the main busbars and the capacitors are electrically connected to one another through the connecting busbars, and
the connecting busbars are formed along an outer surface of the capacitor housing opposite to an inner surface of the capacitor housing which faces the cooling module so as to electrically connect the main busbars and the capacitors.

7. The power unit of claim 1, wherein:
a protrusion is formed at one side of an outer surface of the capacitor housing disposed to correspond to one surface of the power module, and
a groove, which has a shape corresponding to a shape of the protrusion and is positioned to correspond to the protrusion, is formed at one side of an outer surface of the capacitor housing disposed to correspond to the other surface of the power module.

8. The power unit of claim 1, wherein: the power module and the cooling module are joined together.

9. The power unit of claim 1, wherein: the main busbars include:
- a positive DC busbar which is connected to a positive direct current power source;
- a negative DC busbar which is connected to a negative direct current power source; and
- a phase busbar which is disposed at a preset interval from the positive and negative DC busbars.

10. A power conversion apparatus wherein the power units according to claim 1 are stacked in series such that the connecting busbars of the neighboring capacitor modules are in contact with one another, the coolant supply pipes are connected to one another along a single axis, and the coolant discharge pipes are connected to one another along a single axis.

11. The power conversion apparatus of claim 10, further comprising:
elastic members which support the power units at both ends of the power units so as to maintain a state in which the power units are stacked.

12. A motor driving system comprising:
the power conversion apparatus according to claim 10;
a battery which supplies power to the power module;
a board which transmits a control signal to the gate pins of the power module; and
a motor which generates rotational force by using power supplied from the power module.

13. A hybrid vehicle comprising;
the motor driving system according to claim 12; and
an internal combustion engine which generates rotational force together with the motor.

14. A fuel cell vehicle comprising:
the motor driving system according to claim 12; and
a fuel cell which is electrically connected to the battery and produces electricity through a chemical reaction.

15. An electric vehicle which moves by using rotational force generated by the motor driving system according to claim 12.

* * * * *